United States Patent [19]
Sharma et al.

[11] Patent Number: 5,496,756
[45] Date of Patent: Mar. 5, 1996

[54] METHOD FOR FORMING A NONVOLATILE MEMORY DEVICE

[75] Inventors: Umesh Sharma; Jim Hayden; Howard C. Kirsch, all of Austin, Tex.

[73] Assignee: Motorola Inc., Schaumburg, Ill.

[21] Appl. No.: 340,914

[22] Filed: Jan. 30, 1995

Related U.S. Application Data

[62] Division of Ser. No. 235,735, Apr. 29, 1994.

[51] Int. Cl.⁶ .................................................. H01L 21/8247
[52] U.S. Cl. ...................................... 437/52; 437/43
[58] Field of Search ............................... 437/21, 43, 52, 437/83, 915; 257/640, 641, 760, 324

[56] References Cited

U.S. PATENT DOCUMENTS

| | | | |
|---|---|---|---|
| 4,354,255 | 10/1982 | Stewart | 365/154 |
| 4,356,623 | 11/1982 | Hunter | 437/44 |
| 4,432,132 | 2/1984 | Kinsbron et al. | 437/43 |
| 4,619,034 | 10/1986 | Janning | 29/571 |
| 4,720,323 | 6/1988 | Sato | 437/43 |
| 4,786,609 | 11/1988 | Chem | 437/44 |
| 4,800,533 | 1/1989 | Arakawa | 365/228 |
| 4,876,582 | 10/1989 | Janning | 357/23.5 |
| 5,065,362 | 11/1991 | Herdt et al. | 365/154 |
| 5,198,379 | 3/1993 | Adan | 437/41 |
| 5,198,380 | 3/1993 | Harari | 437/43 |
| 5,262,655 | 11/1993 | Ashida | 437/46 |

FOREIGN PATENT DOCUMENTS 000790  3/1981  Japan.

OTHER PUBLICATIONS

Olivo et al., "Charge Trapping and Retention In Ultra–Thin Oxide–Nitride–Oxide Structures", Solid–State Electronics, vol. 34, No. 6, 1991, pp. 609–611.

Chan et al., "A True Single–Transistor Oxide–Nitride–Oxide EEPROM Device", IEEE Electron Device Letters, vol. EDL–8, No. 3, Mar. 1987, pp. 93–95.

Drori et al., "A Single 5V Supply Nonvolatile Static RAM", ISSCC 81, Feb. 19, 1981, pp. 148–149.

Sharma et al., "A Novel Technology for Megabit Density, Low Power, High Speed, NVRAMs", 1993 Symposium On VLSI Technology, May 17–19, 1993, pp. 53–54.

*Primary Examiner*—Tom Thomas
*Attorney, Agent, or Firm*—Daniel D. Hill

[57] ABSTRACT

A nonvolatile SRAM cell (20) includes a six-transistor SRAM cell portion (22) and a three-transistor nonvolatile memory portion (30). The nonvolatile memory portion (30) is connected to one storage node (101) of the SRAM cell portion (22). The nonvolatile SRAM cell (20) is three-dimensionally integrated in four layers of polysilicon. The nonvolatile memory portion (30) includes a thin film memory cell (32) having an oxide-nitride-oxide structure (41), and is programmable with a relatively low programming voltage. The three-dimensional integration of the nonvolatile SRAM cell (20) and relatively low programming voltage results in lower power consumption and smaller cell size.

9 Claims, 7 Drawing Sheets

METHOD FOR FORMING A NONVOLATILE MEMORY DEVICE

This is a divisional of application Ser. No. 08/235,735, filed Apr. 29, 1994.

FIELD OF THE INVENTION

This invention relates generally to memories, and more particularly, to a three-dimensionally integrated nonvolatile static random access memory cell and process.

BACKGROUND OF THE INVENTION

In general, semiconductor memories may be divided into two types, volatile memories and nonvolatile memories. Volatile memories lose stored data when power is removed, whereas nonvolatile memories retain stored data when power is removed. Static random access memories (SRAMs) and dynamic random access memories (DRAMs) are two types of volatile memories. A SRAM cell is comprised of a bistable flip-flop, and data is stored by setting the state of the bistable flip-flop. In a DRAM cell, a capacitor is used to store data.

There are several types of nonvolatile memories. One type of nonvolatile memory is an Erasable Programmable Read Only Memory (EPROM). EPROMs can be erased and reprogrammed by the user using special ultraviolet light equipment. An Electrically Erasable Programmable Read Only Memory (EEPROM) is a type of nonvolatile memory that is electrically reprogrammable using a relatively high voltage, and does not require the special equipment needed for reprogramming EPROMs. MNOS (Metal-Nitride-Oxide-Semiconductor) transistors, SNOS (Polysilicon-Nitride-Oxide-Silicon) transistors, SONOS (Polysilicon-Oxide-Nitride-Oxide-Silicon) transistors are also used for nonvolatile storage, where the storage of charge occurs in the nitride layer.

Nonvolatile RAMs, or NVRAMs, are memories which combine the high speed of SRAMs and non-volatility of a nonvolatile memory, such as an EEPROM. The memory cell of a NVRAM includes a SRAM portion and a nonvolatile portion. During normal operation, the NVRAM appears like a SRAM to a user. However, upon power interruption or any other interrupt sequence, data is transferred from the SRAM portion to the nonvolatile portion. The nonvolatile portion retains the data for an extended period of time. The nonvolatile portion of the NVRAM can include any of the above nonvolatile cells, or others not listed, that have two stable threshold voltage ($V_T$) states. The state of the device can be changed from one stable state to another by altering the charge stored on either a floating silicon gate as in a floating gate transistor of an EEPROM, or in a gate dielectric film as in the MNOS device.

A problem common to many of the above nonvolatile memories is that they require relatively large programming voltages of about 10 to 15 volts for changing their threshold voltages. Also, they can only be re-programmed a limited number of times (typically about 100,000 cycles) before they are unserviceable. In addition, exposure to the large programming voltage can have a detrimental effect on the SRAM portion of the NVRAM, complicating the design of the NVRAM.

Another problem with current NVRAMs is the large size of the cell. A large cell increases the size and cost of the NVRAM array. The large array is due, at least in part, to the increased spacing between elements because of the high programming voltage.

SUMMARY OF THE INVENTION

Accordingly, an integrated circuit nonvolatile memory is provided having a static random access memory cell portion, first and second switches, and a thin film transistor nonvolatile memory cell. The static random access memory cell portion is for storing a bit of binary information. The first switch having a first terminal coupled to a first storage node of the static random access memory cell portion, and a second terminal, the first switch responsive to a first control signal. The thin film transistor nonvolatile memory cell having a first current electrode coupled to the second terminal of the first switch, a second current electrode, and a control electrode. The second switch having a first terminal coupled to a first power supply voltage terminal, and a second terminal coupled to the second current electrode of the nonvolatile memory cell, the second switch responsive to a second control signal. Wherein the volatile memory cell is formed in first, second, third, and fourth layers of polysilicon, and the thin film transistor and the first and second switches are formed in the third and fourth layers of polysilicon, the third and fourth layers of polysilicon overlying the first and the second layers of polysilicon.

In another embodiment, a method for forming an undergated thin film nonvolatile memory device is provided. In another embodiment, a method for forming an overgated thin film nonvolatile memory device is provided. These and other features and advantages will be more clearly understood from the following detailed description taken in conjunction with the accompanying drawings.

DESCRIPTION OF A PREFERRED EMBODIMENT

Generally, the present invention provides a three-dimensionally integrated nonvolatile SRAM cell. The nonvolatile SRAM cell includes a six-transistor SRAM cell portion and a three-transistor nonvolatile memory portion connected to one storage node of the SRAM cell portion. Three-dimensional integration is accomplished by implementing both the N-channel pull-down transistors and the coupling transistors of the SRAM cell portion in the silicon substrate and lower polysilicon layers, and establishing the P-channel thin film pull-up transistors of the SRAM cell portion as well as the nonvolatile cell portion on upper layers of polysilicon above the silicon substrate and lower polysilicon layers. The nonvolatile portion is programmed and erased at relatively low voltages of between 5 and 8 volts. The three-dimensionally integrated nonvolatile SRAM cell results in an NVRAM having lower power consumption and smaller size.

Figure 1:
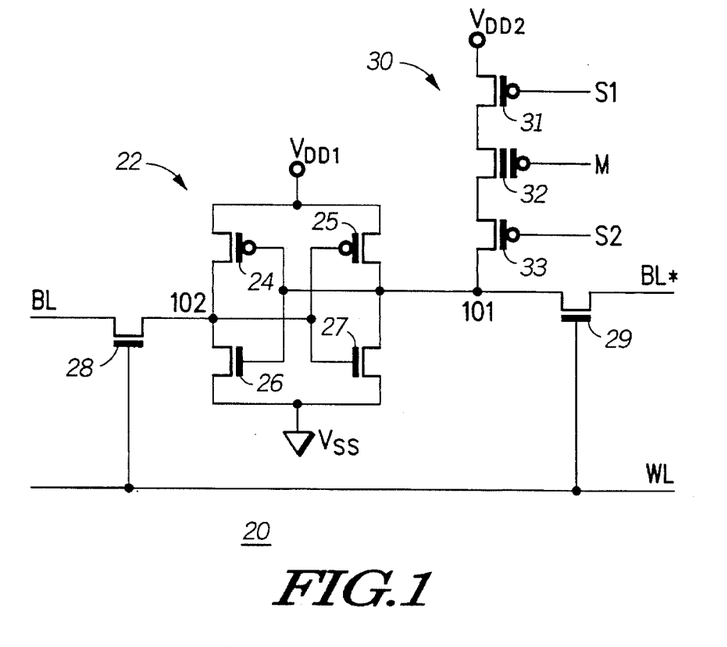
FIG. 1 illustrates in schematic diagram form, a nonvolatile SRAM cell in accordance with the present invention.

The present invention can be more fully described with reference to FIGS. 1–21. FIG. 1 illustrates in schematic diagram form, nonvolatile SRAM cell 20 in accordance with the present invention. Nonvolatile SRAM cell 20 includes six-transistor SRAM cell portion 22 and nonvolatile cell portion 30. SRAM portion 22 includes P-channel thin film pull-up transistors 24 and 25, N-channel pull-down transistors 26 and 27, and coupling transistors 28 and 29. Nonvolatile portion 30 includes thin film select transistors 31 and 33, and thin film nonvolatile memory cell 32.

P-channel transistor 24 has a source connected to a power supply voltage terminal labeled "$V_{DD1}$", a drain connected to node 102, and a gate connected to node 101. P-channel transistor 25 has a source connected to $V_{DD1}$, a drain connected to node 101, and a gate connected to node 102. N-channel transistor 26 has a drain connected to the drain of P-channel transistor 24 at node 102, a source connected a power supply voltage terminal labeled "$V_{SS}$", and a gate connected to the gate of P-channel transistor 24 at node 101. N-channel transistor 27 has a drain connected to the drain of P-channel transistor 25 at node 101, a source connected to $V_{SS}$, and a gate connected to the gate of P-channel transistor 25 at node 102. Coupling transistor 26 is an N-channel transistor and has a first drain/source terminal coupled to a bit line labeled "BL", a gate coupled to a word line labeled "WL", and a second drain/source terminal coupled to node 102. Coupling transistor 29 is an N-channel transistor and has a first drain/source terminal coupled to a bit line labeled "BL*", a gate coupled to word line WL, and a second drain/source terminal coupled to node 101. In the illustrated embodiment, SRAM cell portion 22 is a conventional six transistor SRAM cell. In other embodiments, SRAM cell portion 22 may be a four transistor SRAM cell having load resistors instead of P-channel transistors 24 and 25.

Thin film P-channel transistor 31 has a source connected to a power supply voltage terminal labeled "$V_{DD2}$", a gate for receiving a control signal labeled "S1", and a drain. Thin film nonvolatile memory cell 32 has a source connected to the drain of P-channel transistor 31, a control gate for receiving a control signal labeled "M", and a drain. Thin film P-channel transistor 33 has a source connected to the drain of nonvolatile memory cell 32, a gate for receiving a control signal labeled "S2", and a drain connected to node 101. Power supply voltage terminals $V_{DD1}$ and $V_{DD2}$ both receive a power supply voltage equal to about 3.3 volts. However, during power-up of nonvolatile SRAM cell 20 and during nonvolatile recall operating mode, the supply voltage provided to $V_{DD1}$ ramps up more slowly than the supply voltage provided to $V_{DD2}$. $V_{SS}$ is connected to ground. Thin film nonvolatile memory cell 32 has two stable threshold voltage ($V_T$) states, a low $V_T$ state, and a high $V_T$ state.

Figure 21:
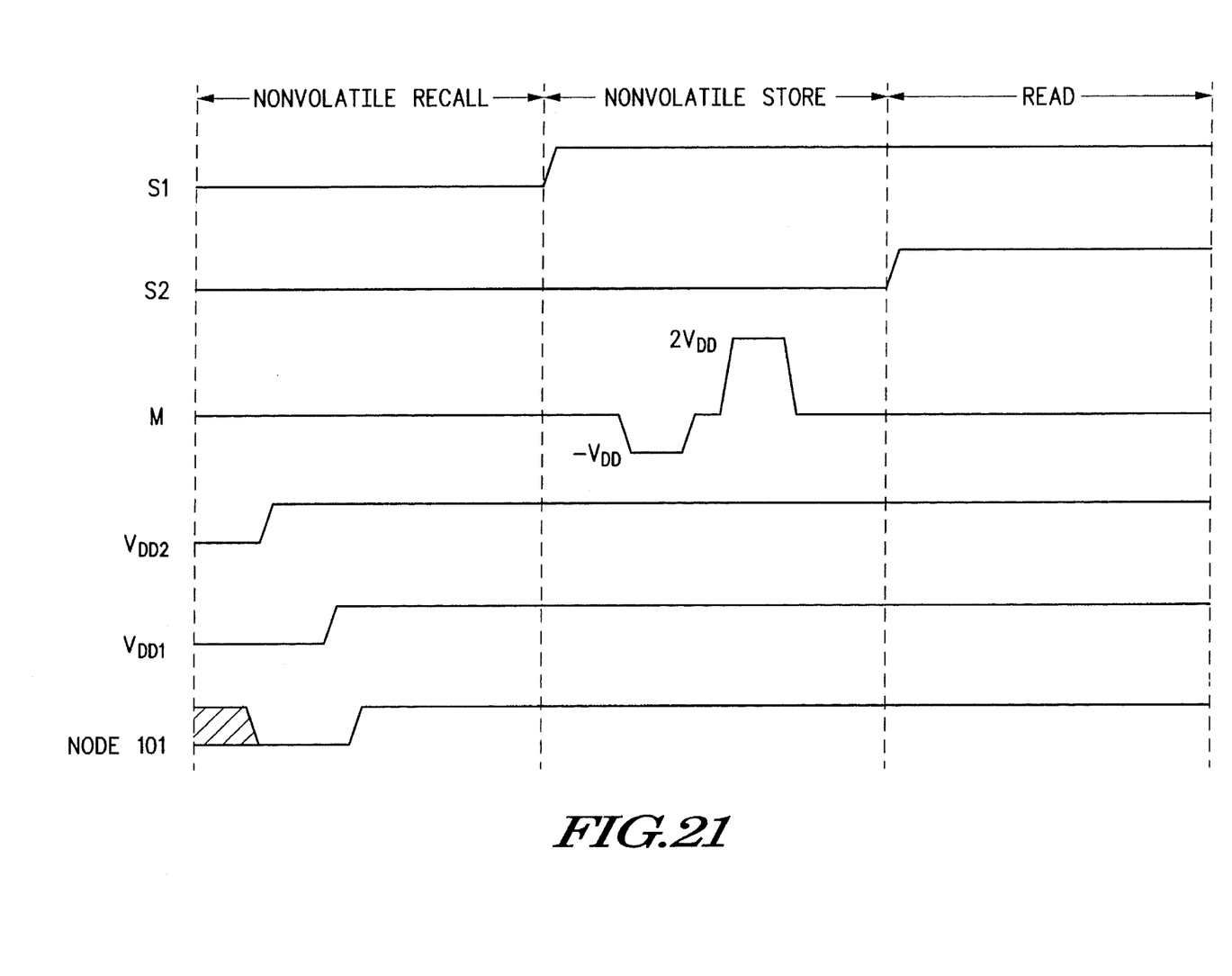
FIG. 21 is a timing diagram of various signals of the nonvolatile SRAM cell of FIG. 1.

Nonvolatile SRAM cell 20 has three operating modes: nonvolatile store, nonvolatile recall, and read. Refer to FIG. 21 for a timing diagram of various signals of the nonvolatile SRAM cell of FIG. 1 during each of the three operating modes.

During the nonvolatile recall operating mode, data is transferred from the thin film nonvolatile memory cell 32 to the SRAM portion 22 via storage node 101. In FIG. 21, the nonvolatile recall operation mode is illustrated during power-up of nonvolatile SRAM cell 20. Control signals S1 and S2 are a logic low voltage, which causes thin film P-channel transistors 31 and 33 to be conductive. P-channel transistors 31 and 33 function as conventional transistor switches. A power supply voltage equal to about 3.3 volts is then provided to $V_{DD2}$. Then, a power supply voltage equal to about 3.3 volts is provided to $V_{DD1}$. $V_{DD2}$ receives a power supply voltage before $V_{DD1}$. SRAM portion 22 powers-up in the logic state as determined by the $V_T$ of thin film nonvolatile memory cell 32. If thin film nonvolatile memory cell 32 has been programmed to have a low $V_T$, thin film nonvolatile memory cell 32 is conductive, coupling storage node 101 to $V_{DD2}$. This causes storage node 101 to receive a logic "one" voltage, which is latched by SRAM portion 22. If thin film nonvolatile memory cell 32 is programmed to have a high $V_T$, storage node 101 is not connected to $V_{DD2}$. Storage node 101 will then store a logic "zero", which is latched by SRAM portion 22.

In the nonvolatile store mode, data is transferred from SRAM cell portion 22 to the nonvolatile portion 30. Control signal S2 is provided as a logic low voltage, causing P-channel transistor 33 to be conductive. Control signal M is initially pulsed to a programming voltage equal to a negative $V_{DD2}$ (−3.3 volts) for a period of about 1 millisecond and then pulsed positive to about $2V_{DD2}$ (6.6 volts). Depending on the logic state of storage node 101, nonvolatile memory cell 32 will either be programmed (high $V_T$) or erased (low $V_T$). For example, if storage node 101 is in a logic low state, the $V_T$ of nonvolatile memory cell 32 does not change during the negative pulse, but is erased to have a low $V_T$ during the positive pulse. On the other hand, if storage node 101 is storing a logic high (about 3.3 volts), nonvolatile memory cell 32 is programmed to a high $V_T$. After the store mode operation is complete, control signal S2 is provided as a logic high voltage, causing P-channel transistor 33 to be substantially non-conductive. This isolates nonvolatile memory cell 32 from storage node 101 so that a change of the voltage at storage node 101 does not inadvertently change the $V_T$ of nonvolatile memory cell 32.

During the read mode, control signals S1 and S2 are provided as logic high voltages, causing P-channel transistors 31 and 33 to be substantially nonconductive. This isolates nonvolatile memory cell 32 from node 101 and $V_{DD2}$-SRAM portion 22 can now function independently as a conventional SRAM cell having normal read and write cycles.

Figure 2:
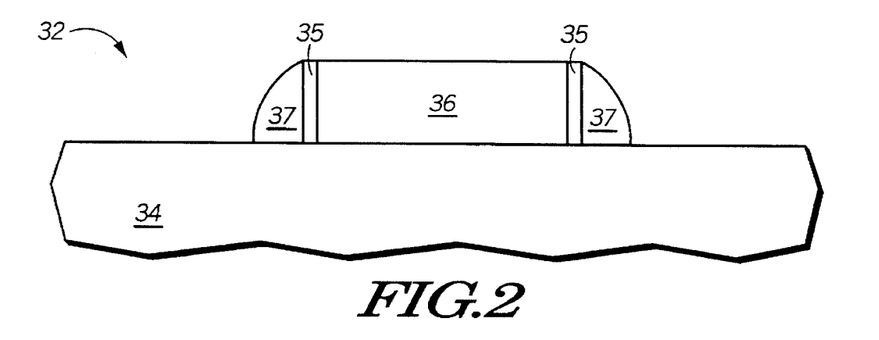
FIGS. 2–7 are cross-sectional views which illustrate a process for making one embodiment of a nonvolatile portion of the nonvolatile SRAM cell of FIG. 1.

FIGS. 2–7 are cross-sectional views which illustrate a process for making one embodiment of nonvolatile memory cell 32 of FIG. 1. In FIG. 2, thin film nonvolatile memory cell 32 includes insulating substrate 34. The composition of insulating substrate 34 can be any appropriate insulating substrate including, but not limited to, silicon dioxide, silicon nitride, and aluminum oxide. Insulating substrate 34 may also be a substrate having an overlying dielectric layer. A highly doped polysilicon gate 36 is formed on insulating substrate 34. The surface of polysilicon gate 36 is oxidized and nitride sidewall spacers 37 are constructed laterally adjacent to each edge of polysilicon gate 36. Oxide layer 35 is shown between sidewall spacers 37 and polysilicon gate 36. The nitride spacers will serve to smooth the topography created by polysilicon gate 36 and eliminate any sharp corners or edges of polysilicon gate 36 from protruding into overlying layers.

Figure 3:
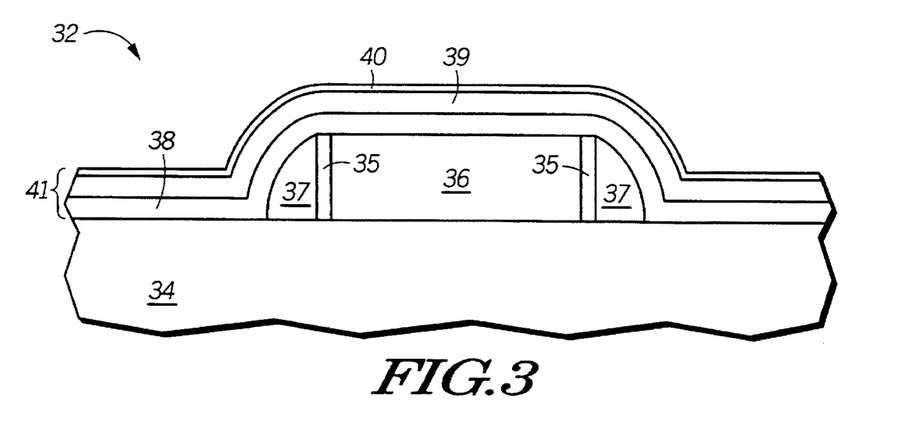

FIG. 3 illustrates the formation of O—N—O (oxide-nitride-oxide) structure 41. O—N—O structure 41 includes oxide layer 38, nitride layer 39, and tunnel oxide 40. CVD (chemical vapor deposition) oxide layer 38 is deposited on insulating substrate 34 and a top surface of polysilicon gate 36. Oxide layer 38 is relatively thick (40–60 angstroms), and could also be constructed from a TEOS (tetraethyl orthosilicate) film. The thickness of oxide layer 38 is tailored to allow programming in the 5–8 volt range. A relatively thin silicon nitride layer 39 is deposited over oxide layer 38. A thin tunnel oxide 40 is formed on the surface of nitride layer 39 either by low temperature thermal oxidation of the surface of nitride layer 39, or by deposition of an ultra-thin TEOS film. Thin tunnel oxide 40 has a thickness in the range of 15–20 angstroms. If tunnel oxide 40 is too thick, the required programming voltage will be larger, and if tunnel oxide 40 is too thin (less than 10 angstroms), charge retention time will be small as the charge will tend to leak away.

Figure 4:
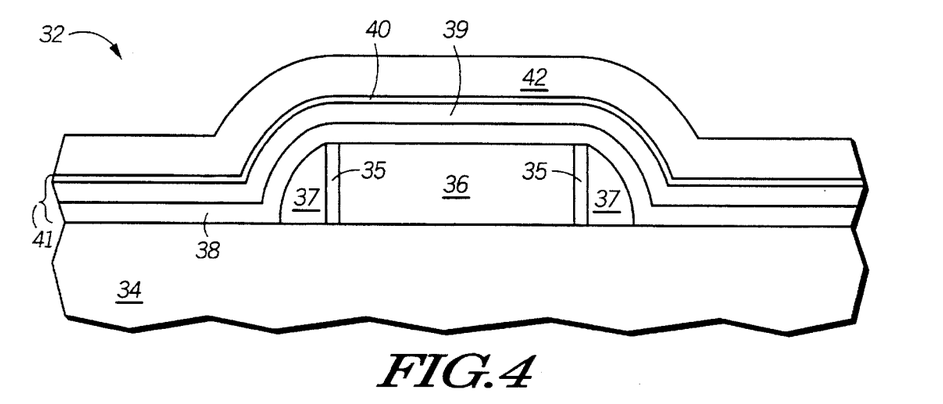
Figure 5:
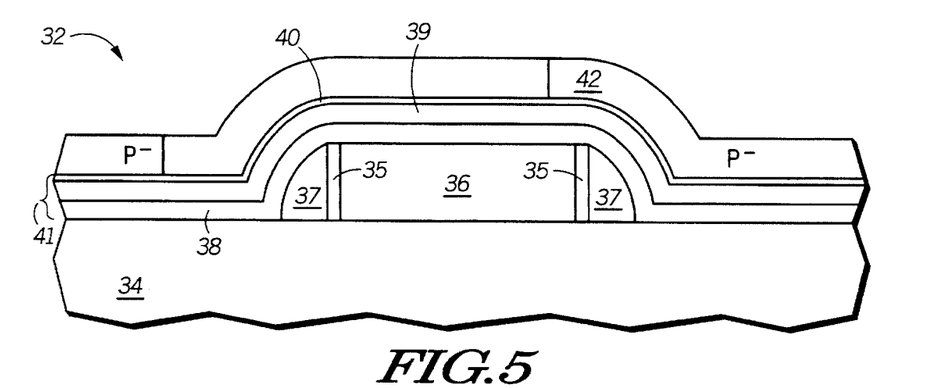
Figure 6:
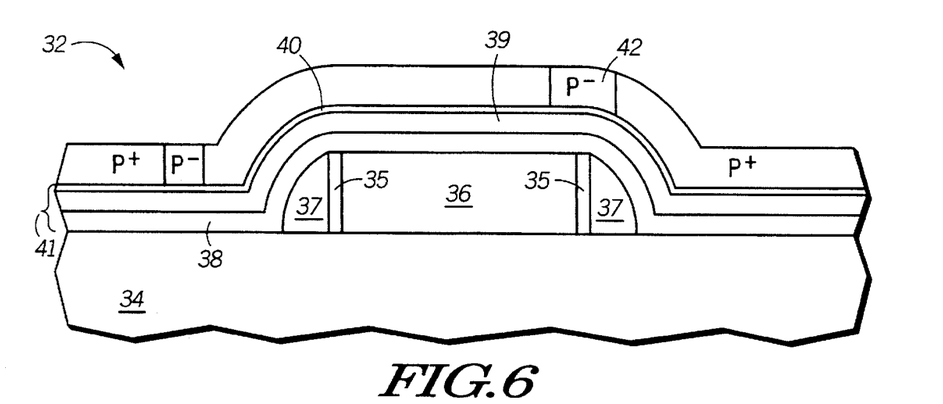

As illustrated in FIG. 4, a polysilicon layer 42 having a thickness of between 500–1000 angstroms is chemically deposited on O—N—O structure 41 and annealed to form a relatively defect free conductive polysilicon channel region. The thickness of polysilicon layer 42 is such that nonvolatile memory cell 32 is a fully depleted device. As illustrated in FIG. 5 and FIG. 6, polysilicon layer 42 is then doped using conventional implant techniques to a form a lightly doped P-channel region, P– LDD (lightly doped drain) region, and P+ source/drain regions. Note that the P– LDD regions are in asymmetrical alignment with respect to polysilicon gate 36. The implants overlap one end but underlap the other end of the polysilicon gate 36. The asymmetry is useful for reducing a leakage current of thin film nonvolatile memory cell 32 when nonvolatile memory cell 32 is non-conductive.

Figure 7:
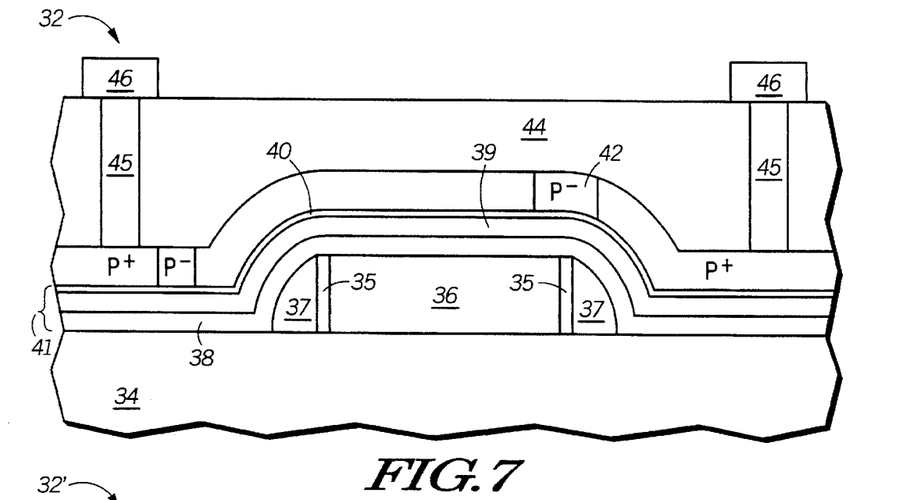

FIG. 7 illustrates low temperature BPSG (borophosphosilicate glass) 44, deposited over polysilicon layer 42. BPSG 44 is a dielectric layer. Contact holes 45 are etched in BPSG 44 expose a contact portion of the source and drain regions of nonvoltage memory cell 32. A tungsten plug is used to form an electrical contact for the source and drain regions. Thereafter, a layer of aluminum, or aluminum based alloys, is deposited and etched to form electrical contacts 46. Note that only source and drain contacts are shown in FIG. 7. A contact to polysilicon gate 36 is made laterally and is therefore not shown.

FIGS. 8–13 are cross-sectional views which illustrate a process for making an overgated nonvolatile memory cell 32', which can be substituted for nonvolatile memory cell 32 in FIG. 1.

Figure 8:
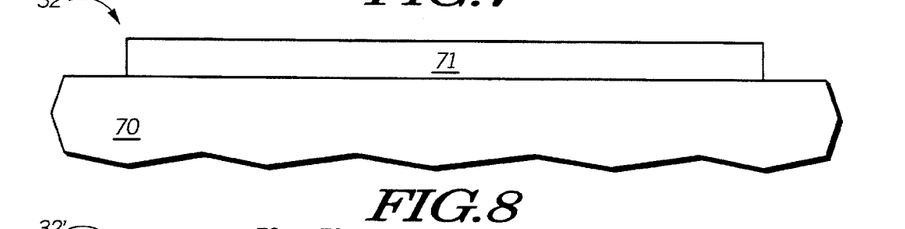
FIGS. 8–13 are cross-sectional views which illustrate a process for making another embodiment of the nonvolatile portion of the nonvolatile SRAM cell of FIG. 1.

FIG. 8 illustrates polysilicon layer 71 chemically deposited on insulating substrate 70. The composition of insulating substrate 70 is the same as that of insulating substrate 34 of FIG. 2, and can be any appropriate insulating substrate including, but not limited to, silicon dioxide, silicon nitride, and aluminum oxide. Polysilicon layer 71 is a conductive layer that is doped to provide a background doping concentration and etched to delineate the various device regions. Non-recrystalized polysilicon is used for polysilicon layer 71.

Figure 9:
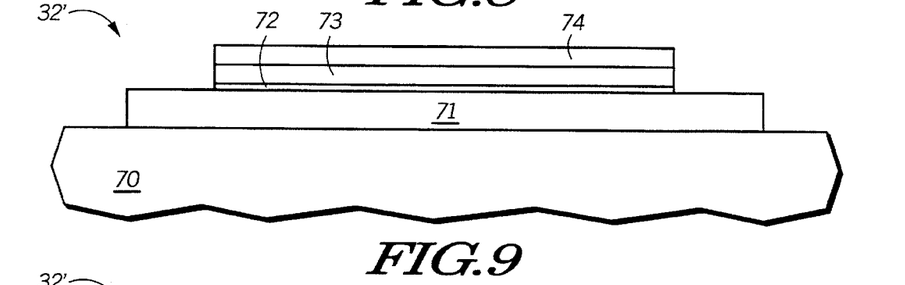

In FIG. 9, relatively thin tunnel oxide 72 is grown or deposited over polysilicon layer 71. Thin tunnel oxide 72 is grown by oxidizing a surface of polysilicon layer 71. Thin tunnel oxide 72 has a thickness in the range of 15–20 angstroms. Thin silicon nitride layer 73 is then deposited over thin tunnel oxide 72. Oxide layer 74 is formed by oxidizing the surface of nitride layer 73, or by depositing oxide layer 74 over nitride layer 73.

Figure 10:
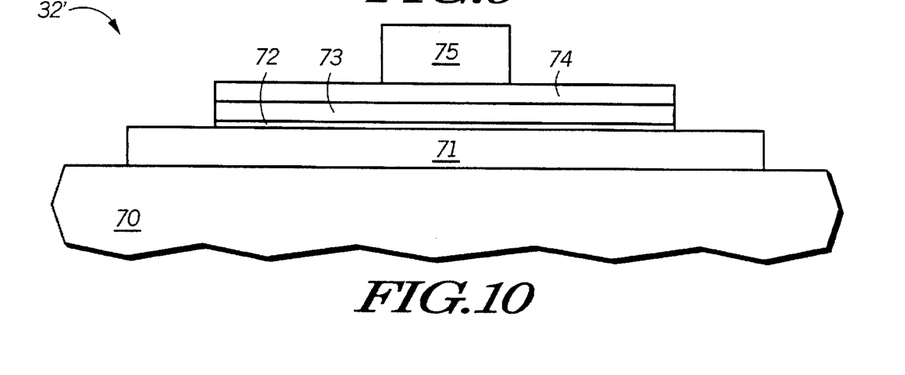

FIG. 10 illustrates a heavily doped and etched polysilicon gate 75 deposited on oxide layer 74.

Figure 11:
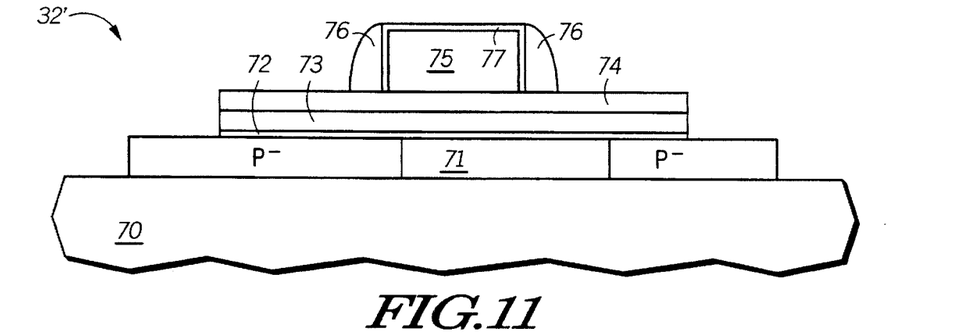
Figure 12:
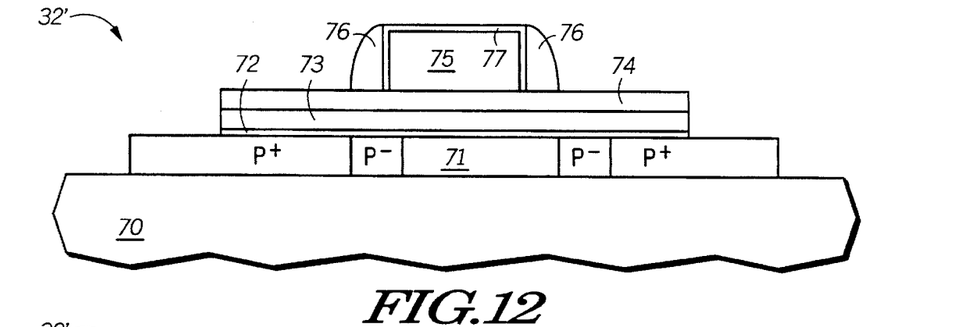

In FIG. 11, asymmetric source/drain LDD regions are defined using a P-mask in a manner which produces an overlap of the gate-source region and an underlap of the gate-drain region. After oxidation of the surface of polysilicon gate 75 to form a thin oxidation layer 77, nitride spacers 76 are formed around the edges of polysilicon gate 75. FIG. 12 illustrates implanted P+ source/drain regions in polysilicon layer 71.

Figure 13:
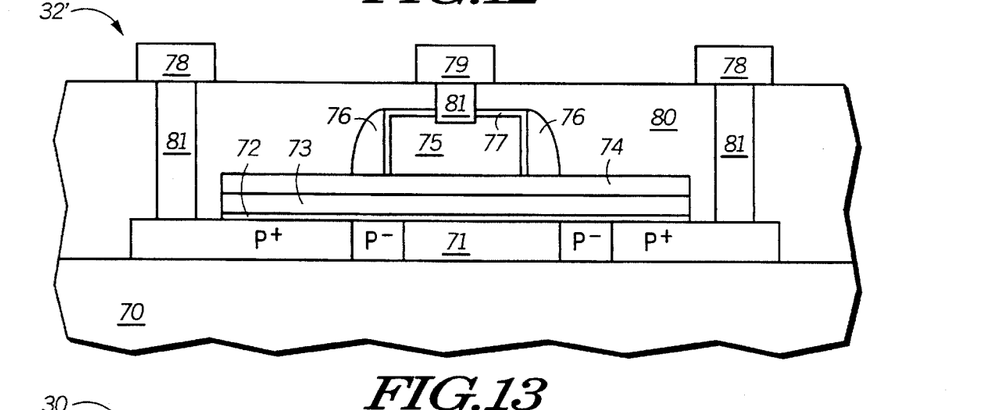

FIG. 13 illustrates the conventional process steps of deposition of a BPSG ILD (interlevel dielectric) layer 80 overlying nonvolatile memory cell 32'. Contact holes 81 are etched in BPSG layer 80 to the source, drain, and gate regions of nonvoltage memory cell 32'. Thereafter, a layer of aluminum or aluminum based alloys is deposited and etched to form electrical contacts 78 and 79. Electrical contacts 78 are source/drain contacts, and electrical contact 79 is a gate contact.

FIGS. 14–19 are cross-sectional views which illustrate a process for making nonvolatile cell portion 30 of FIG. 1. The process of FIGS. 14–19 merges the nonvolatile memory device 32' with P-channel transistors 31 and 33 (FIG. 1) in one single overgated, thin film nonvolatile cell portion 30. The merging of the series transistors further reduces the size of nonvolatile cell portion 30.

Figure 14:
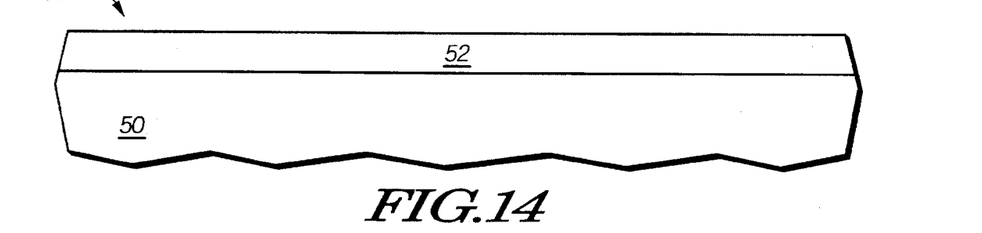
FIGS. 14–19 are cross-sectional views which illustrate a process for making another embodiment of the nonvolatile portion of the nonvolatile SRAM cell of FIG. 1.

FIG. 14 illustrates insulating substrate 50 having overlying thin polysilicon layer 52 deposited thereon. Polysilicon layer 52 is doped to form a channel region.

Figure 15:
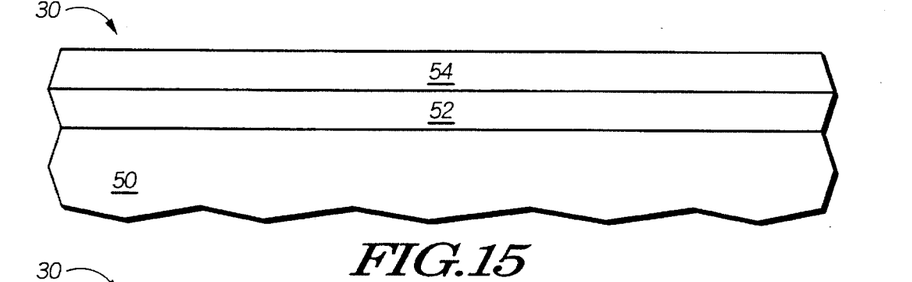

In FIG. 15, oxide layer 54 is formed on polysilicon layer 52 using a conventional oxidation or deposition process to produce an oxide thickness of about 100 angstroms. Gate oxide layer 54 functions as the gate oxide for P-channel transistors 31 and 33.

Figure 16:
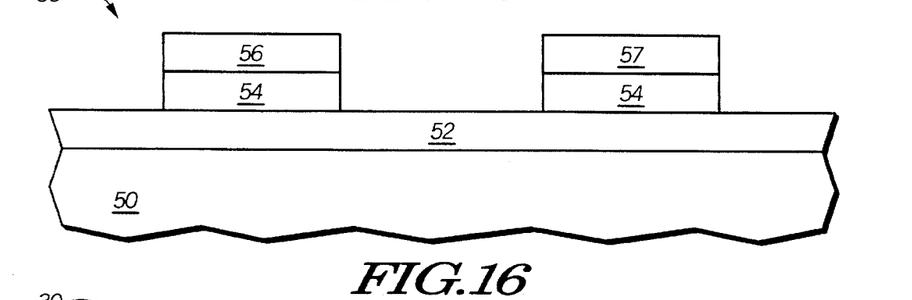

FIG. 16 illustrates polysilicon gates 56 and 57. Polysilicon gates 56 and 57 are formed from a heavily doped polysilicon layer that is formed on top of gate oxide layer 54 and defined to produce the gates of P-channel transistors 31 and 33, respectively. Using an etch mask, oxide from the middle of the two gate regions is removed to provide a window region in gate oxide layer 54.

Figure 17:
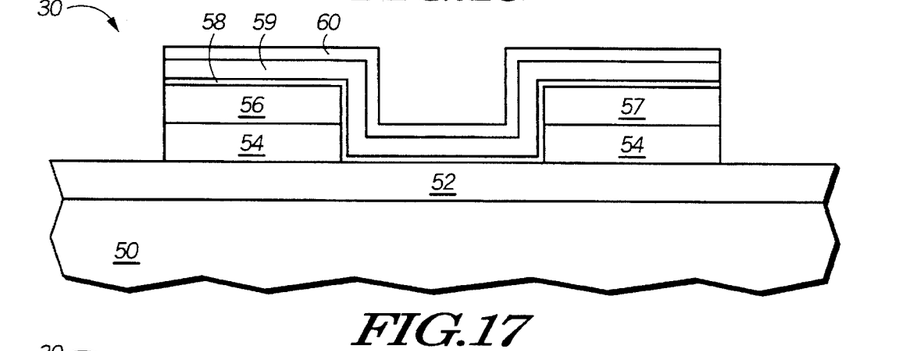

FIG. 17 illustrates the formation of tunnel oxide layer 58, nitride layer 59, and oxide layer 60. Thin tunnel oxide 58 is grown or deposited over and between polysilicon gates 56 and 57. Thin tunnel oxide 58 has a thickness in the range of 15–20 angstroms. Thin silicon nitride layer 59 is then deposited over thin tunnel oxide 58. Oxide layer 60 is formed by oxidizing the surface of nitride layer 59, or by depositing oxide layer 60 over nitride layer 59.

Figure 18:
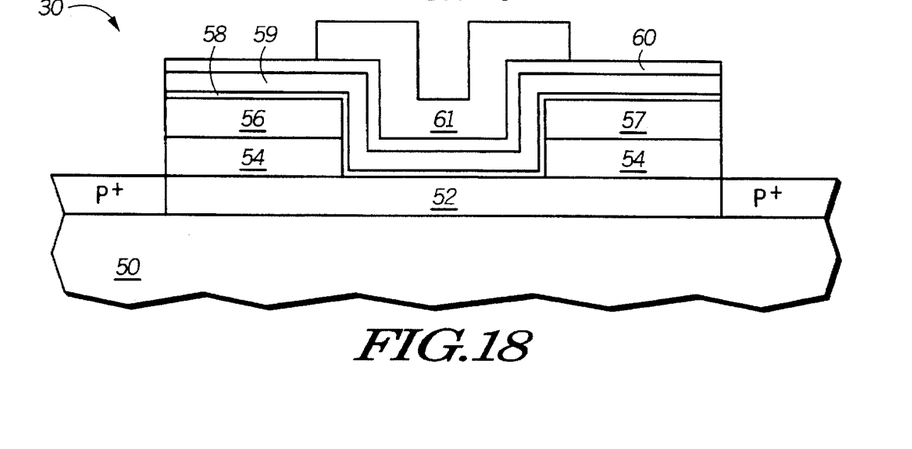

FIG. 18 illustrates polysilicon gate 61 deposited, doped and defined to form the gate of nonvolatile memory cell 32 of FIG. 1.

Figure 19:
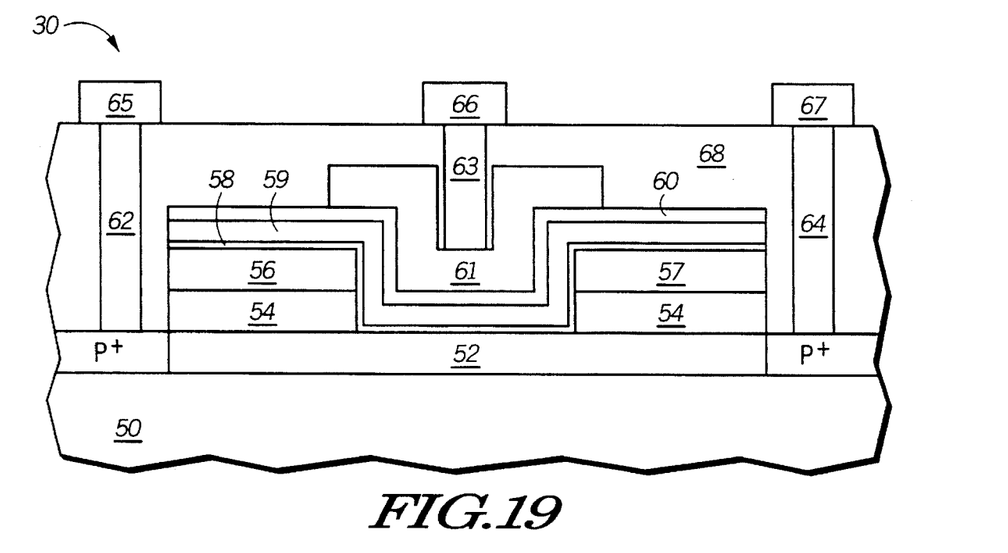

In FIG. 19, P+ source/drain implants are formed in a self-aligned manner in polysilicon layer 52. A conventional BPSG ILD layer 68 is formed overlying nonvolatile portion 30. Contact holes 62, 64, and 63 are etched in BPSG layer 68 to expose the source, drain, and gate regions, respectively. Thereafter, a layer of aluminum or aluminum based alloys is deposited and etched to form electrical contacts 65, 66, and 67.

The drain of P-channel transistor 31 is connected to the power supply voltage terminal $V_{DD2}$, and the source of P-channel transistor 33 is connected to storage node 101 (not shown in FIG. 19).

Figure 20:
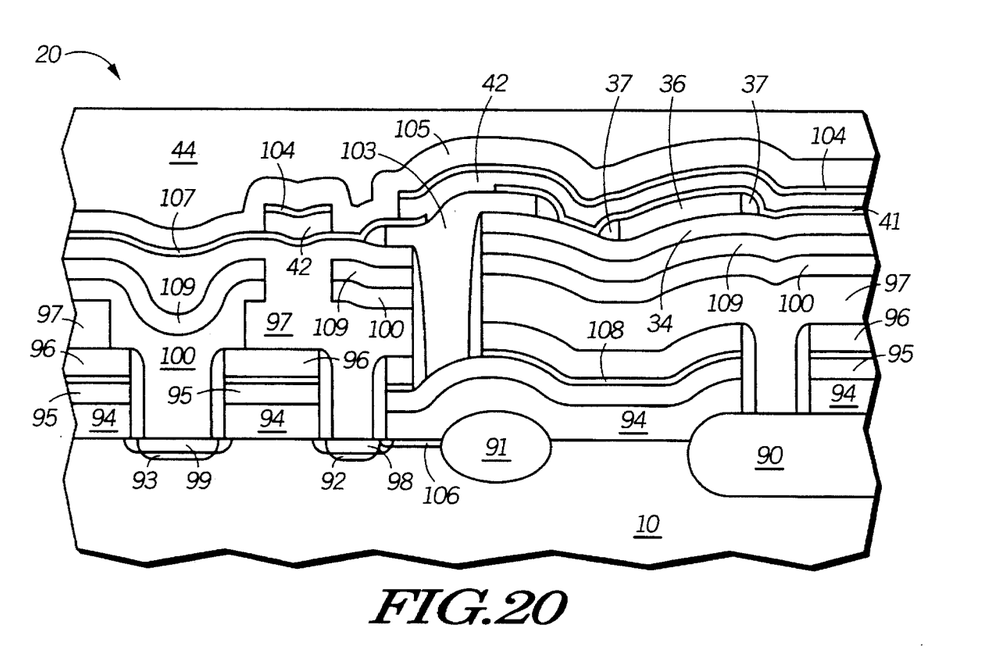
FIG. 20 is a cross-sectional view of an embodiment of the nonvolatile SRAM cell of FIG. 1.

FIG. 20 is a cross-sectional view of nonvolatile SRAM cell 20 of FIG. 1. Nonvolatile SRAM cell 20 is fabricated on substrate 10 and is implemented using four layers of polysilicon. Field oxide regions 90 and 91 are diffused into substrate 10 to isolate the active regions of nonvolatile SRAM cell 20. Implants 92, 93, 98 and 99 are source/drain implants for N-channel transistors 26, 27, 28, and 29. Buried contacts 106 connect the gate of P-channel transistor 24 to the gate of N-channel transistor 26, and the gate of P-channel transistor 25 to the gate of N-channel transistor 27.

First polysilicon layer 94 is deposited over substrate 10 and forms the gates of N-channel transistors 26, 27, 28 and 29. Tungsten silicide layer 95 is deposited over first polysilicon layer 94 and is used to provided word line strapping for coupling transistors 28 and 29. ARC (anti-reflective coating) 108 is formed above tungsten silicide layer 95, and is used for defining the gate regions of transistors 26, 27, 28, and 29. Oxide cap 96 is a TEOS layer that isolates the source/drain contacts in polysilicon layer 95 and polysilicon layer 94 from second polysilicon layer 100. TEOS structure 97 isolates the gates of P-channel transistors 24 and 25, from the gates of N-channel transistors 26 and 27. Note that TEOS structure 97 can also be any other form of plasma deposited oxide using low temperature deposition. Plug contact 103 forms the gate contacts for P-channel transistors 24 and 25 and N-channel transistors 26 and 27. Thin film gate oxide 107 forms the gates of P-channel transistors 24, 25, 31, and 33.

Second polysilicon layer 100 is deposited over oxide layer 97, and is used as window poly for connecting the source/drain regions of N-channel transistor 26 to $V_{SS}$ and the source/drain regions of N-channel transistor 28 to bit line BL. Also, second polysilicon layer 100 is used as window poly for connecting the source/drain regions of N-channel transistor 27 to $V_{SS}$ and the source/drain regions of N-channel transistor 29 to bit line BL*. Titanium silicide 109 is deposited over second polysilicon layer 100 and etched to provide strapping from power supply terminal $V_{SS}$ to ground. O—N—O structure 41 is deposited as described above with reference to FIG. 3.

A third polysilicon layer is used to form polysilicon gate 36 (also illustrated in FIG. 2). Oxide layer 105 isolates BPSG 44 from the other layers of nonvolatile SRAM cell 20. Oxide layer 105 is approximately 1000 angstroms thick and consists of TEOS. BPSG 44 is also shown in FIG. 7. A layer of aluminum or aluminum based alloys is deposited over BPSG 44 and etched to form electrical contacts 46 (shown in FIG. 7).

A fourth polysilicon layer is deposited over O—N—O structure 41 and forms thin film polysilicon layer 42 as illustrated in FIG. 5 and FIG. 6, and also gate contacts 103 for P-channel transistors 24 and 25, and N-channel transistors 26 and 27. ARC 104 is formed above thin film polysilicon layer 42 for patterning the gates of P-channel transistors 24 and 25.

By three-dimensionally integrating nonvolatile SRAM cell 20 in four layers of polysilicon, surface area on semiconductor substrate 10 is more efficiently used, resulting in a higher density NVRAM array. Three-dimensional integration is made possible by the use on nonvolatile portion 30, which can be programmed and erased with relatively low voltages (5–8 volts). The use of lower power supply voltages and lower programming voltages results in lower power supply consumption. As the feature size is reduced in advanced sub-half micron technologies, the maximum operating voltages are reduced. Thus, three-dimensional integration using a power supply voltage of 3.3 volts with a conventional nonvolatile memory cell process results in a very dense array. In addition, the lower programming voltage reduces the stress on the SRAM portion without complicated isolation devices.

While the invention has been described in the context of a preferred embodiment, it will be apparent to those skilled in the art that the present invention may be modified in numerous ways and may assume many embodiments other than that specifically set out and described above. For example, thin film P-channel transistors 26 and 27 can be replaced with resistor loads and thin film P-channel transistors 31, 32, and 33 may be replaced by thin film N-channel transistors. Nonvolatile memory cell 32 can be produced in a self-aligned manner resulting in a smaller memory cell but at the expense of complicated and expensive processing. The charge storage region of nonvolatile memory cell 32 can also be easily changed. Nitride layer 39 can be replaced by another high dielectric constant material such as $Ta_2O_5$, $Al_2O_3$, and $TiO_2$. Various forms of oxynitridation processes, well-known in published literature, can also be used to construct thin tunnel oxide 38 or the thicker oxide 40 in O—N—O structure 41. Accordingly, it is intended by the appended claims to cover all modifications of the invention which fall within the true spirit and scope of the invention.

What is claimed is:

1. A method for forming an undergated thin film nonvolatile memory device comprising the steps of:

providing an insulating substrate;

forming a gate electrode overlying the insulating substrate;

forming a sidewall spacer laterally adjacent to an edge of the gate electrode;

depositing a first oxide layer overlying the insulating substrate and over a top surface of the gate electrode;

depositing a silicon nitride layer over the first oxide layer;

oxidizing a surface of the silicon nitride layer to form a relatively thin second oxide layer overlying the silicon nitride layer, wherein the second oxide layer is relatively thin compared to the first oxide layer;

depositing a semiconductive layer overlying the second oxide layer; and implanting source and drain regions in the semiconductive layer.

2. The method of claim 1, wherein the step of oxidizing a surface of the silicon nitride layer comprises oxidizing the silicon nitride layer to form the second oxide layer having a thickness of 15 to 20 angstroms.

3. The method of claim 1, wherein the step of implanting source and drain regions in the semiconductive layer comprises asymmetrically aligning the source and drain regions with the gate electrode.

4. The method of claim 1, wherein the semiconductive layer is chemically deposited polysilicon.

5. The method of claim 1, further comprising the steps of:

forming a dielectric layer overlying the semiconductive layer;

forming openings in the dielectric layer to expose a contact portion of each of the source and drain regions; and forming an electrical contact to the contact portions of each of the source and drain regions.

6. A method for forming a thin film nonvolatile memory device comprising the steps of:

providing an insulating substrate;

depositing a semiconductive layer overlying the insulating substrate;

depositing a gate oxide layer overlying the semiconductive layer;

forming first and second gate electrodes overlying the gate oxide layer;

etching a window region in the gate oxide layer between the first and second gate electrodes;

forming a first oxide layer overlying the first and second gate electrodes and the window region;

depositing a silicon nitride layer overlying the first oxide layer;

depositing a second oxide layer overlying the silicon nitride layer, wherein the second oxide layer is relatively thick compared to the first oxide layer;

forming a third gate electrode overlying the second oxide layer between the first and second gate electrodes, the third gate electrode overlying a portion of the first gate electrode and the second gate electrode; and implanting source and drain regions in the semiconductive layer.

7. The method of claim 6, wherein the step of forming the first oxide layer comprises forming the first oxide layer having a thickness of 15 to 20 angstroms.

8. The method of claim 6, wherein the semiconductive layer is chemically deposited polysilicon.

9. The method of claim 6, further comprising the steps of:

forming a dielectric layer overlying the gate oxide layer, the second oxide layer and the third gate electrode;

forming openings in the dielectric layer to expose a contact portion of each of the source and drain regions; and forming an electrical contact to the contact portions of each of the source and drain regions.

* * * * *